United States Patent
Chien et al.

(10) Patent No.: US 11,024,995 B2
(45) Date of Patent: Jun. 1, 2021

(54) ELECTRICAL CONNECTOR ASSEMBLY HAVING METAL COVER

(71) Applicant: Advanced Connectek Inc., New Taipei (TW)

(72) Inventors: Min-Lung Chien, New Taipei (TW); Ta-Teh Meng, New Taipei (TW); Wen-Yu Wang, New Taipei (TW); Yu-Chai Yeh, New Taipei (TW); Ping Shi, New Taipei (TW); Jizhou Li, New Taipei (TW)

(73) Assignee: Advanced Connectek Inc., New Taipei (TW)

( * ) Notice: Subject to any disclaimer, the term of this patent is extended or adjusted under 35 U.S.C. 154(b) by 0 days.

(21) Appl. No.: 16/541,176

(22) Filed: Aug. 15, 2019

(65) Prior Publication Data

US 2020/0059024 A1 Feb. 20, 2020

(30) Foreign Application Priority Data

Aug. 17, 2018 (CN) .......................... 201810941131.8

(51) Int. Cl.
*H01R 12/77* (2011.01)
*H01R 13/631* (2006.01)
*H01R 12/71* (2011.01)
*H01R 13/62* (2006.01)
*H01R 13/6595* (2011.01)
(Continued)

(52) U.S. Cl.
CPC ......... *H01R 12/775* (2013.01); *H01R 12/716* (2013.01); *H01R 12/774* (2013.01); *H01R 13/62* (2013.01); *H01R 13/631* (2013.01);
*H01R 13/6595* (2013.01); *H05K 1/023* (2013.01); *H05K 1/181* (2013.01); *H05K 1/189* (2013.01); *H05K 2201/09063* (2013.01); *H05K 2201/10189* (2013.01); *H05K 2201/10371* (2013.01); *H05K 2201/10545* (2013.01)

(58) Field of Classification Search
CPC .. H01R 12/775; H01R 12/716; H01R 12/774; H01R 13/62; H01R 13/631; H01R 13/6595; H05K 2201/09063; H05K 2201/10189; H05K 2201/10371; H05K 2201/10545
See application file for complete search history.

(56) References Cited

U.S. PATENT DOCUMENTS 6,008,994 A * 12/1999 Bates ................... H05K 5/0269
                                                                361/728
D491,535 S * 6/2004 Chien .......................... D13/154
(Continued)

FOREIGN PATENT DOCUMENTS

CN          103794950          5/2014

*Primary Examiner* — Abdullah A Riyami
*Assistant Examiner* — Nader J Alhawamdeh
(74) *Attorney, Agent, or Firm* — JCIPRNET

(57) ABSTRACT

An electrical connector assembly including an electrical connecting member, at least one connector, and at least one metal cover is provided. The connector is disposed at and electrically connected to the electrical connecting member. The metal cover is disposed on the electrical connecting member, such that the electrical connecting member is located between the metal cover and the connector, and the connector is covered by the electrical connecting member.

16 Claims, 6 Drawing Sheets

(51) Int. Cl.
*H05K 1/18* (2006.01)
*H05K 1/02* (2006.01)

(56) References Cited

U.S. PATENT DOCUMENTS

| | | | | |
|---|---|---|---|---|
| 8,083,542 | B2* | 12/2011 | Kodaira | H01R 12/594 |
| | | | | 439/497 |
| 9,178,297 | B2* | 11/2015 | Kodaira | H01R 12/774 |
| 10,312,617 | B2* | 6/2019 | Wang | H01R 12/77 |
| 2005/0148244 | A1* | 7/2005 | Tsai | H01R 27/02 |
| | | | | 439/630 |
| 2006/0040558 | A1* | 2/2006 | Ho | H01R 13/658 |
| | | | | 439/607.01 |
| 2011/0151682 | A1* | 6/2011 | Kodaira | H01R 12/88 |
| | | | | 439/55 |
| 2014/0120788 | A1* | 5/2014 | Kodaira | H01R 13/6275 |
| | | | | 439/892 |
| 2020/0059024 | A1* | 2/2020 | Chien | H01R 12/775 |

* cited by examiner

ELECTRICAL CONNECTOR ASSEMBLY
HAVING METAL COVER

CROSS-REFERENCE TO RELATED
APPLICATION

This application claims the priority benefit of China patent application serial no. 201810941131.8, filed on Aug. 17, 2018. The entirety of the above-mentioned patent application is hereby incorporated by reference herein and made a part of the specification.

BACKGROUND OF THE INVENTION

Field of the Invention

The disclosure relates to an electrical connector assembly.

Description of Related Art

Due to the current trend towards miniaturization of connectors, the gap between terminals of connectors is further reduced, or issues such as crosstalk and signal interference are likely to occur in implementation. Therefore, it is difficult to apply such connectors to cases having high-frequency requirements. In particular, at this stage, on a cable connector of a FPC or the like, there is still no effective EMI prevention mechanism against high-frequency signal interference, which is one of the issues to be improved or solved.

Furthermore, in a cable connector in the trend towards miniaturization, the connector and the cable are generally combined with each other in a mutually overlapping state. However, because of this, when a user is mounting a connector, the user inserts the connector at the risk of misalignment because the view is blocked by the cable, which causes difficulty in assembly and takes more assembly time.

SUMMARY OF THE INVENTION

The invention provides an electrical connector assembly that provides shielding effect against signal interference and facilitates convenience for assembling.

The electrical connector assembly of the invention includes an electrical connecting member, at least one connector, and at least one metal cover. The connector is disposed at and electrically connected to the electrical connecting member. The metal cover is disposed on the electrical connecting member. The electrical connecting member is located between the connector and the metal cover, and the connector is covered by the electrical connecting member.

In an embodiment of the disclosure, the electrical connecting member is a flexible printed circuit (FPC) board or a rigid circuit board.

In an embodiment of the disclosure, the electrical connecting member includes at least one grounding part, and the metal cover covers and is electrically connected to the grounding part.

In an embodiment of the disclosure, the electrical connector assembly is a board-to-board connector assembly.

In an embodiment of the disclosure, an orthogonal projection of the connector on the electrical connecting member is within the electrical connecting member.

In an embodiment of the disclosure, the metal cover includes at least one combining structure.

In an embodiment of the disclosure, the metal cover further includes a body and a plurality of side skirt parts, and the side skirt parts are formed by extending and bending from the body.

In an embodiment of the disclosure, the connector is adapted to be mated with another connector on a circuit board and the metal cover is assembled to the circuit board and covers the connectors that are mated with each other. The combining structure is at least one of the side skirt parts. The circuit board further includes an electrical conducting structure and another grounding part for disposing the electrical conducting structure. When the metal cover is assembled to the circuit board, the combining structure is disposed on the electrical conducting structure, and the metal cover is electrically connected to the another grounding part via the combining structure and the electrical conducting structure.

In an embodiment of the disclosure, the connector is adapted to be mated with another connector on a circuit board and the metal cover is assembled to the circuit board and covers the connectors that are mated with each other. The combining structure is a locking part extending from the side skirt part. The circuit board further includes a locking hole and another grounding part, and the another grounding part is located in the locking hole. A locking member is adapted to pass through the locking part to combine to the locking hole and connect to the another grounding part, and the metal cover is electrically connected to the another grounding part via the locking part and the locking member.

In an embodiment of the disclosure, the electrical connector assembly further includes at least one guiding member extending from the side skirt part, and the guiding member is placed in a guiding hole defined on the circuit board.

Based on the above, the electrical connector assembly is configured such that the metal cover is disposed on the electrical connecting member, and the orthogonal projection of the connector on the electrical connecting member is located within the range of the orthogonal projection of the metal cover on the electrical connecting member. In other words, the connector is substantially fixed under the metal cover, and the relative position between the two is fixed. Accordingly, when the connector of the electrical connector assembly is to be mated with another electrical connector, the user can use the metal cover as the assembly target to avoid mating misalignment. In addition, the metal cover can also provide signal shielding effect for the connectors that are mated with each other, and particularly, effectively improve EMI or RFI during high-speed signal transmission.

To provide a further understanding of the aforementioned and other features and advantages of the disclosure, exemplary embodiments, together with the reference drawings, are described in detail below.

DESCRIPTION OF THE EMBODIMENTS

Figure 1:
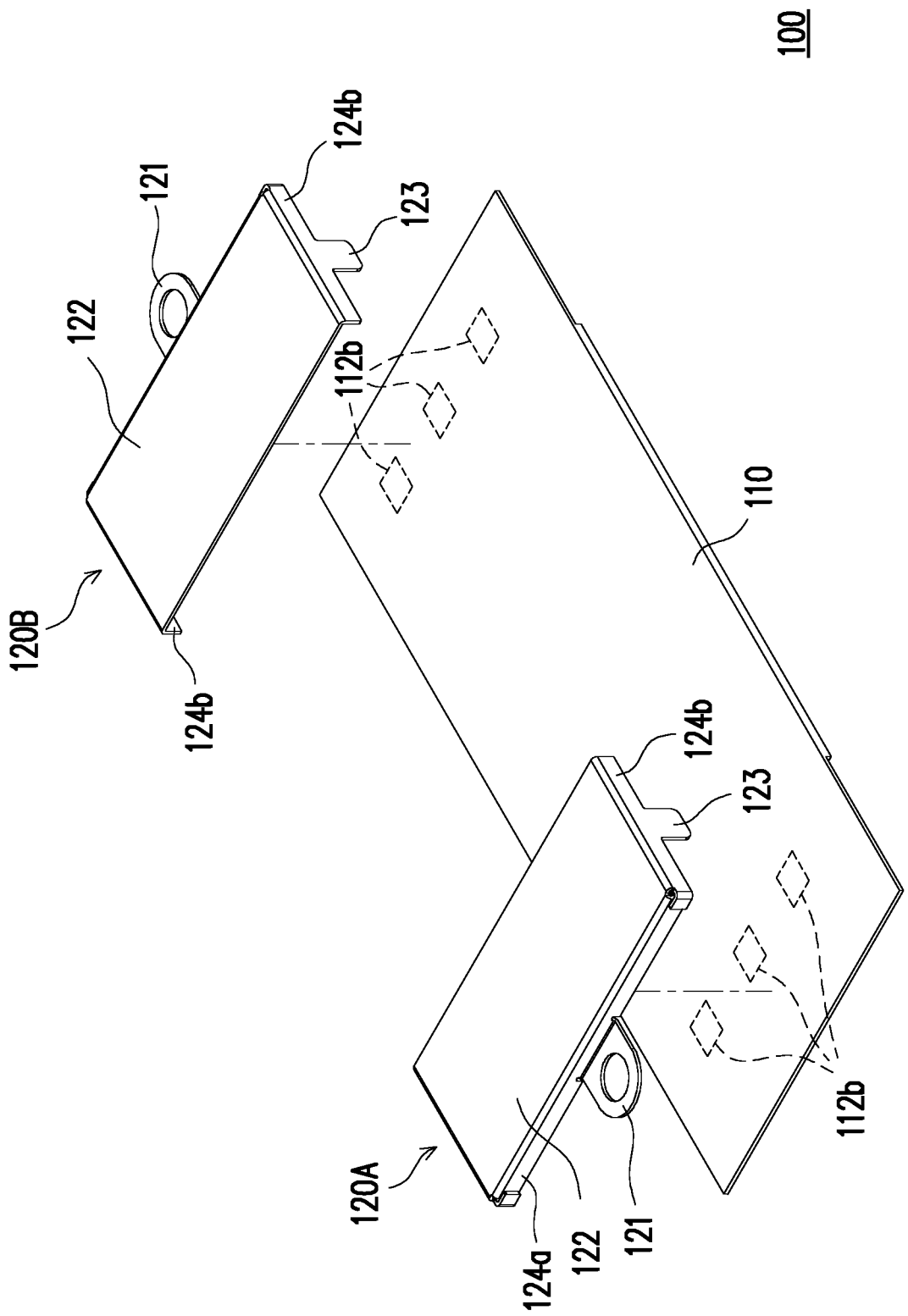
FIG. 1 is an exploded view of an electrical connector assembly according to an embodiment of the invention.
Figure 2:
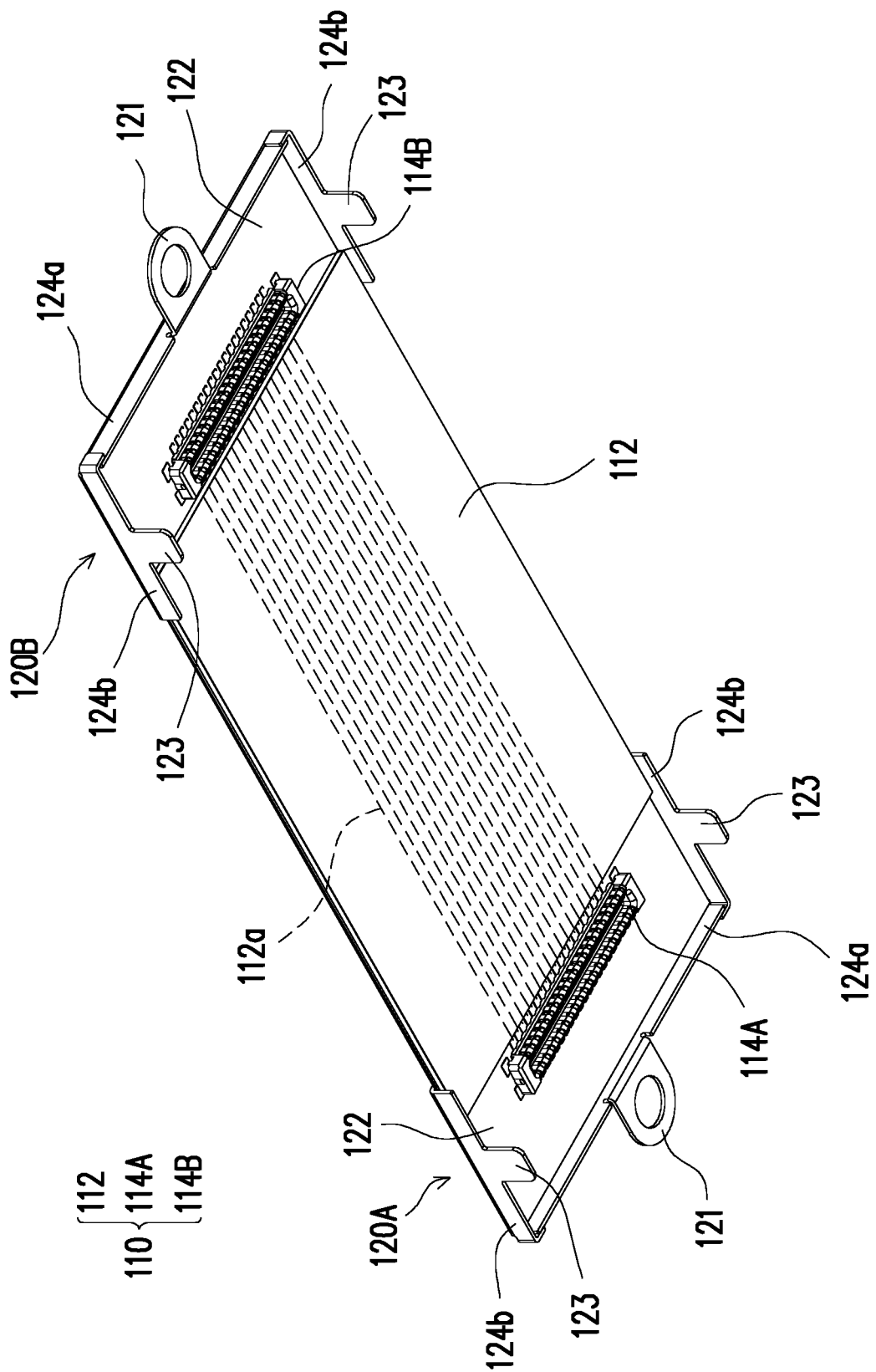
FIG. 2 is a schematic view of the electrical connector assembly of FIG. 1 after assembly from another viewing angle.

FIG. 1 is an exploded view of an electrical connector assembly according to an embodiment of the invention. FIG. 2 is a schematic view of the electrical connector assembly of FIG. 1 after assembly from another viewing angle. Referring to both FIG. 1 and FIG. 2, in the present embodiment, an electrical connector assembly 100 includes an electrical connecting member 110, at least one connector, and at least one metal cover. Here, a pair of connectors 114A and 114B and a pair of metal covers 120A and 120B are shown as an example. However, as shown in the figures, the connector 114A and the metal cover 120A located on one side and the connector 114B and the metal cover 120B located on the other side have substantially the same configurations. Therefore, the configuration of the other side can be learned from the connector 114A and the metal cover 120A on the one side.

In the present embodiment, the electrical connecting member 110 is, for example, a flexible printed circuit (FPC) board. The connectors 114A and 114B are respectively disposed on two opposite sides of the electrical connecting member 110, and a plurality of circuits 112a are electrically connected between the connectors 114A and 114B by the electrical connecting member 110, so that the electrical connector assembly 100 can be regarded as a board-to-board connector assembly that can be used by a user as an electrical connection interface between two different electronic devices (e.g., two different circuit boards). In another unillustrated embodiment, the electrical connecting member may also be a rigid circuit board (e.g., a printed circuit board having a multi-layer structure).

Referring to FIG. 1 again, the electrical connecting member 110 further includes at least one grounding part (a plurality of grounding pads 112b are shown here as an example), which is located on the upper surface of a carrier 112 and is electrically connected to grounds of the circuits 112a. When the metal covers 120A and 120B are disposed on and cover an upper surface of the carrier 112 of the electrical connecting member 110, the metal covers 120A and 120B cover and are electrically connected to the grounding pads 112b. In other words, the plurality of grounds of the circuits 112a can thus be electrically connected to the metal covers 120A and 120B to achieve the common ground effect.

The connection relationship between the metal covers 120A and 120B and the carrier 120 of the electrical connecting member 110 is not limited herein, and they may be fixed to each other, for example, through adhesion by an electrically conductive adhesive, tin soldering, or laser welding. The effect of electrical connection between the grounding pads 112b and the metal covers 120A and 120B may also be achieved through the same connection means.

Figure 3:
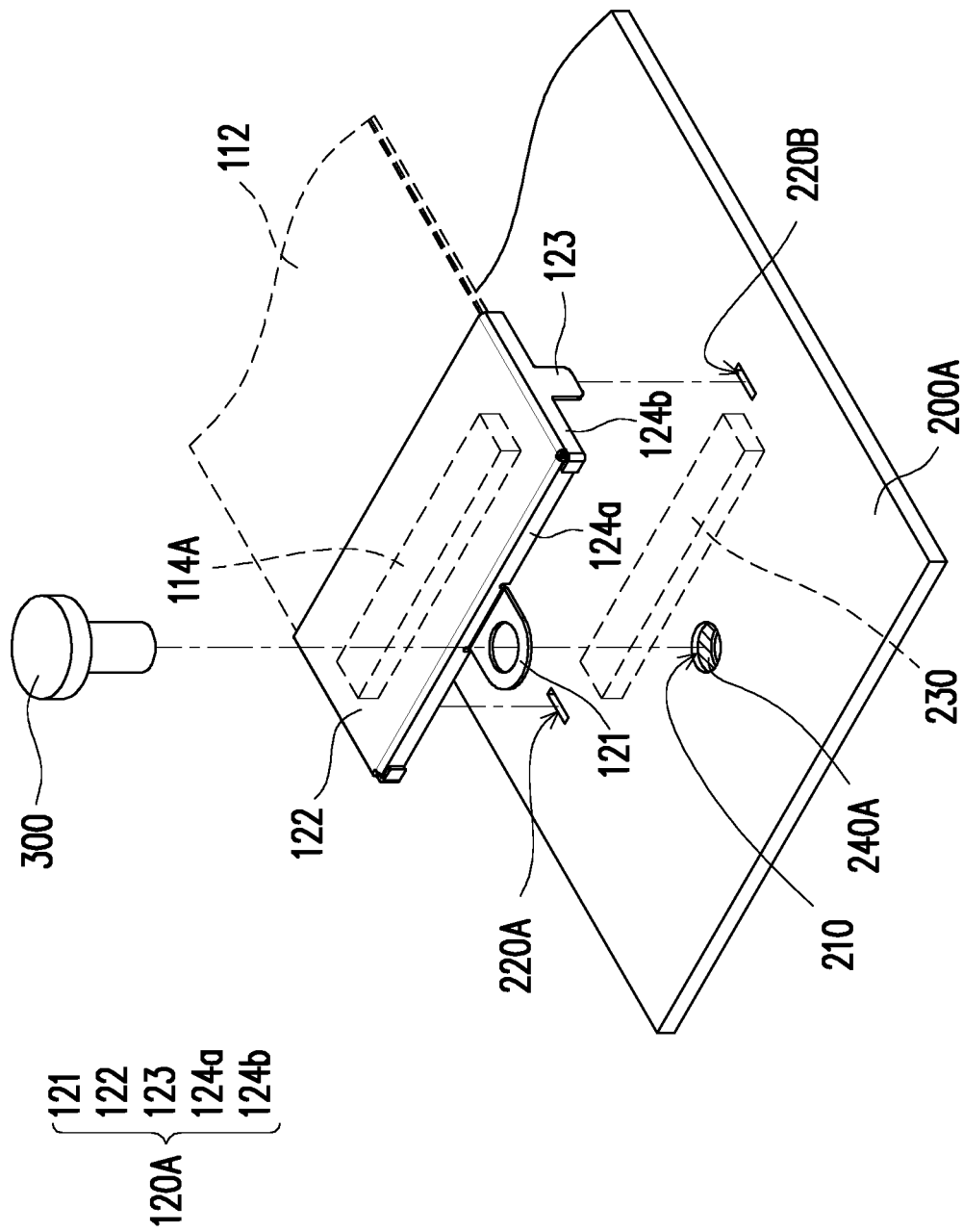
FIG. 3 is a schematic view of mating of a portion of the electrical connector assembly with another connector.

As mentioned above, to accommodate the trend towards miniaturization, as shown in FIG. 1 and FIG. 2, the carrier 112 of the electrical connecting member 110 is formed with an eave structure at its two opposite ends, so that the connectors 114A and 114B can be disposed under the eave structures. However, because of this, the view is blocked during assembly and it is required to use the metal covers 120A and 120B as alternative targets. Accordingly, FIG. 3 of the present embodiment is a schematic view of mating of a portion of the electrical connector assembly with another connector. Referring to FIG. 2 and FIG. 3 first, when the metal covers 120A and 120B are combined with the electrical connecting member 110, the electrical connecting member 110 is substantially located between the connector 114A or 114B and the metal cover 120A or 120B, and the orthogonal projection of the connector 114A or 114B on the electrical connecting member 110 is located within the range of the orthogonal projection of the metal cover 120A or 120B on the electrical connecting member 110. In other words, the connector 114A or 114B is covered by the metal cover 120A or 120B and the connectors 114A and 114B cannot be directly viewed during assembly. However, because of this, the metal covers 120A and 120B can be used instead as the assembly targets in the present embodiment. The reason lies in that, after being combined with the electrical connecting member 110, the metal covers 120A and 120B have fixed relative positions with respect to the corresponding connectors 114A and 114B, which allows the user to complete the mating operation directly through the metal covers 120A and 120B when performing mating of connectors.

Specifically, referring to FIG. 3 again, here, the connector 114A is mated with a connector 230 on a circuit board 200A as an example. In the present embodiment, the metal cover 120A includes a body 122 and a plurality of side skirt parts 124a and 124b, and the side skirt parts 124a and 124b are formed by extending and bending from the body 122. Moreover, the metal cover 120A also includes guiding members 123 and a combining structure, so that when the metal cover 120A is assembled onto the circuit board 200A, the metal cover 120A and the circuit board 200A can be aligned with each other by using the guiding members 123, and the metal cover 120A and the circuit board 200A can be fixed together by using the combining structure. In the present embodiment, the guiding member 123 extends from the side skirt part 124b, and the combining structure is a locking part 121 extending from the side skirt part 124a. In FIG. 3, the side skirt part (opposite to the side skirt part 124b) on the other side is not shown due to the viewing angle, but it similarly includes the same guiding member 123. Correspondingly, the circuit board 200A has guiding holes 220A and 220B and a locking hole 210, which surround the connector 230 and correspond to the guiding members 123 and the locking part 121. Accordingly, the metal cover 120A can be smoothly positioned on the circuit board 200A through the coordination of the guiding members 123 and the guiding holes 220A and 220B. Meanwhile, the metal cover 120A can be fixed onto the circuit board 200A by passing a locking member 300 through the locking part 121 to assemble to the locking hole 210. After assembly, the metal cover 120A and the circuit board 200A substantially form an enclosed space, and the connectors 114A and 230 that are mated with each other are located in the enclosed space and are covered by the metal cover 120A. Accordingly, the required shielding effect can be provided to reduce issues such as electromagnetic interference (EMI) or radio-frequency interference (RFI) during signal transmission. Meanwhile, as the locking member 300 is locked into the locking hole 210 through the locking part 121, the locking member 300 is thus connected to a grounding part 240A located in the locking hole 210. Therefore, through its locking part 121, the metal cover 120A is electrically connected to the grounding part 240A of the circuit board 200A via the locking member 300 to provide the required grounding effect.

Figure 4:
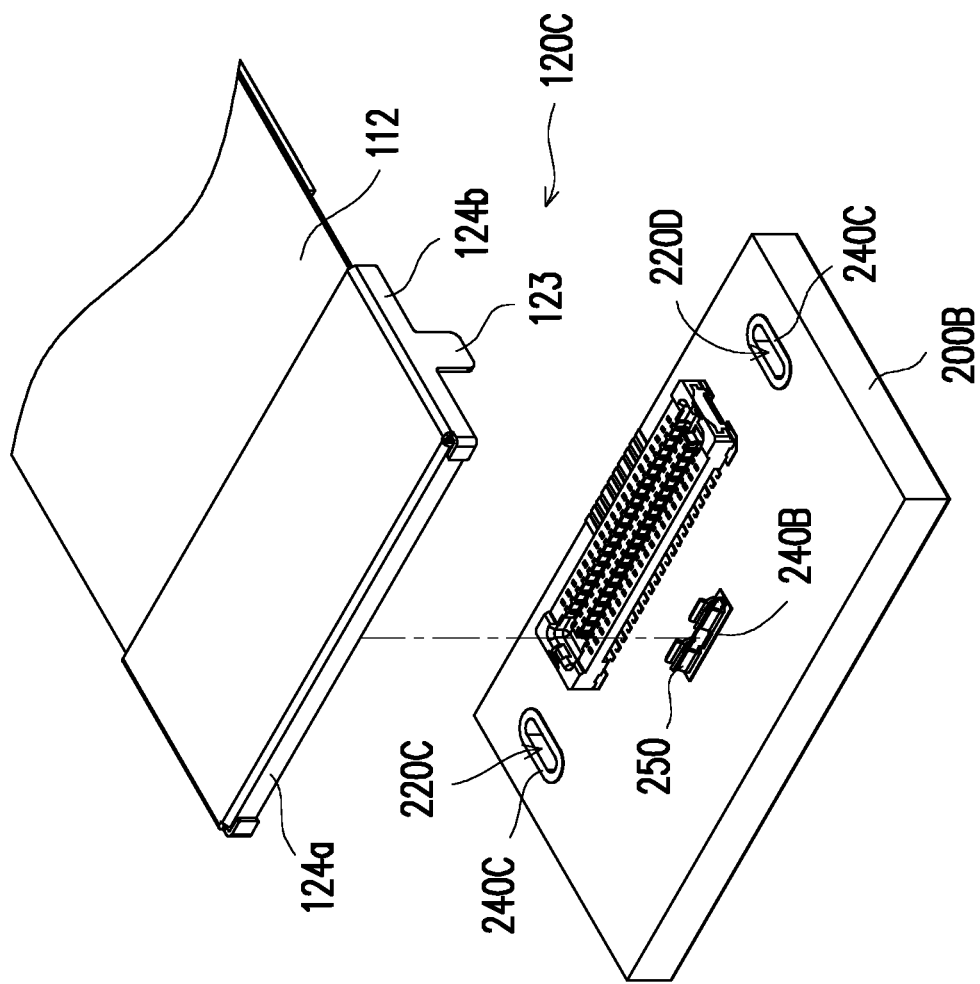
FIG. 4 is a schematic view of mating of a portion of the electrical connector assembly with another connector according to another embodiment of the invention.

FIG. 4 is a schematic view of mating of a portion of the electrical connector assembly with another connector according to another embodiment of the invention. The difference from the embodiment shown in FIG. 3 lies in that, in a metal cover 120C of the present embodiment, the combining structure is the side skirt part 124a protruding from the carrier 112, and a circuit board 200B further includes an electrical conducting structure 250, guiding holes 220C and 220D, and a grounding part 240B. The electrical conducting structure 250 is disposed on the grounding part 240B, so that when the metal cover 120C is combined with the circuit board 200B, the side skirt part 124a of the metal cover 120C can be clamped by the electrical conducting structure 250, and the metal cover 120C can be electrically connected to the grounding part 240B of the circuit board 200B via the side skirt part 124a and the electrical conducting structure 250. In other words, in the present embodiment, the combining structure of the metal cover 120C for assembling with the circuit board 200B is the side skirt part 124a of the metal cover 120C, and the electrical conducting structure 250 is presented in a form of clamping structure that can be used to fix the side skirt part 124a. The corresponding positional relationship of the guiding members 123, the guiding holes 220C and 220D, the side skirt parts 124a and 124b, and the electrical conducting structure 250 is not limited herein. In another unillustrated embodiment, the electrical conducting structure 250 may instead correspondingly clamp the side skirt part 124b, and the guiding members 123 may instead extend from the side skirt part 124a.

In addition, the circuit board 200B of the embodiment further includes grounding parts 240C respectively disposed in the guiding holes 220C and 220D, so that when the guiding members 123 are inserted into the guiding holes 220C and 220D, the metal cover 120C can also be electrically connected to the grounding parts 240C via the guiding members 123. It is noted that the grounding parts 240C of the present embodiment may also be disposed in the guiding holes 220A and 220B in the embodiment of FIG. 3 to achieve the same grounding effect.

Figure 5:
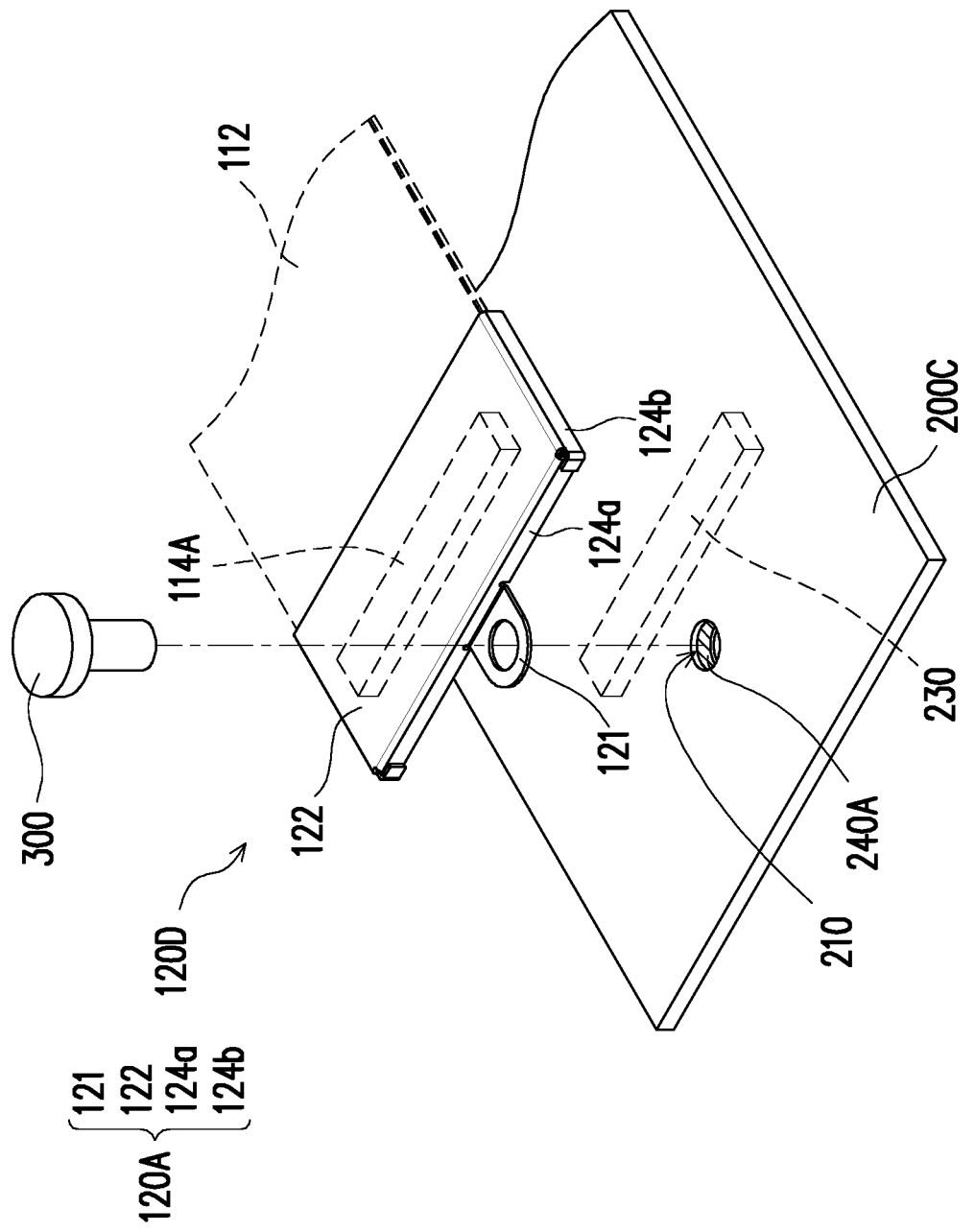
FIG. 5 is a schematic view of mating the electrical connector assembly with a connector of another embodiment.

FIG. 5 is a schematic view of mating the electrical connector assembly with a connector of another embodiment. Referring to FIG. 5, the difference from the embodiment shown in FIG. 3 lies in that a metal cover 120D only includes the side skirt parts 124a and 124b and the locking part 121 and does not include the guiding members 123. In other words, the required combining operation between the metal cover 120D and a circuit board 200C can be completed by passing the locking member 300 through the locking part 121 to lock into the locking hole 210. Of course, the metal cover 120D is also electrically connected to the grounding part 240A of the circuit board 200C to provide the required grounding effect through its locking part 121 and the locking member 300.

Figure 6:
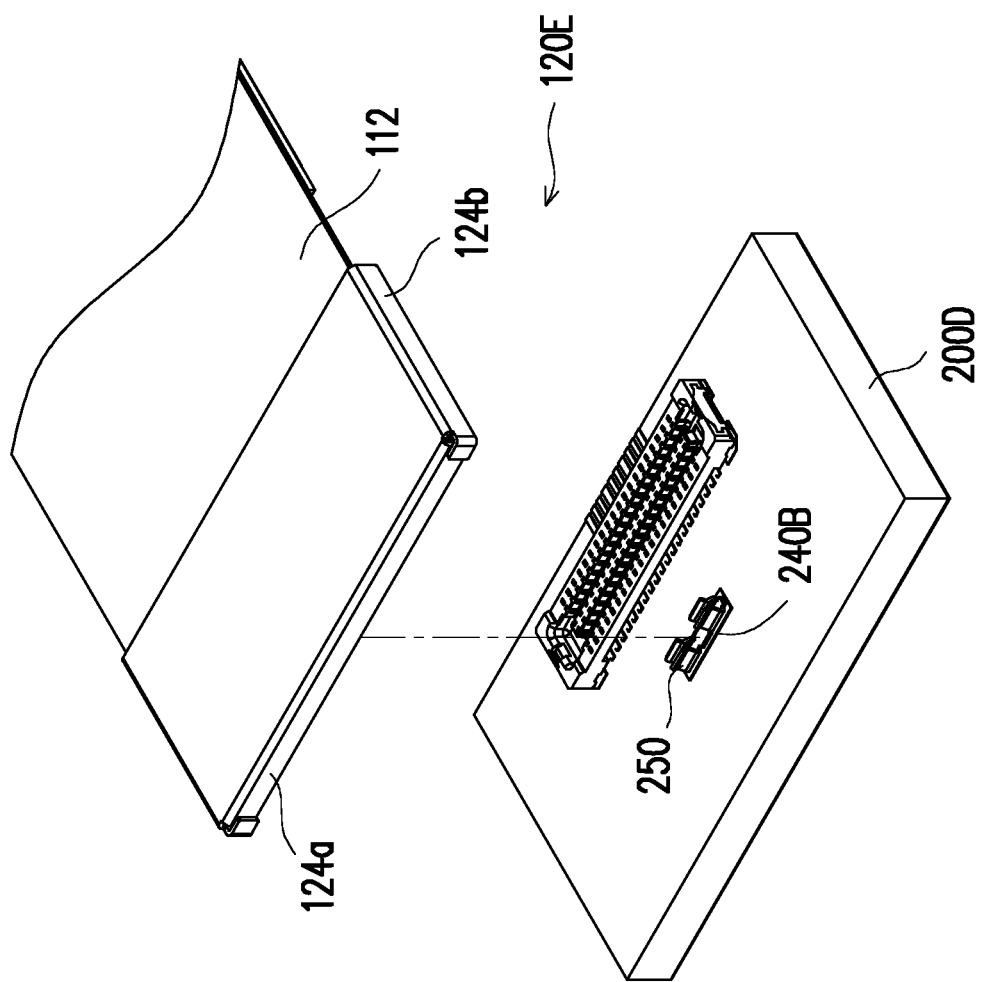
FIG. 6 is a schematic view of mating of the electrical connector assembly with a connector of another embodiment.

FIG. 6 is a schematic view of mating of the electrical connector assembly of another embodiment with a connector. Referring to FIG. 6, the difference from the embodiment of FIG. 4 lies in that a metal cover 120E does not include the guiding members 123, and instead of the configuration above, the metal cover 120E is directly mated with the electrical conducting structure 250 by its side skirt part 124a and is clamped and fixed by the electrical conducting structure 250. Similarly, through the side skirt part 124a and the electrical conducting structure 250, the metal cover 120E is electrically connected to the grounding part 240B of a circuit board 200D.

In summary of the embodiments above, the electrical connector assembly is configured such that the metal cover is disposed on the electrical connecting member, and the orthogonal projection of the connector on the electrical connecting member is located within the range of the orthogonal projection of the metal cover on the electrical connecting member. In other words, the connector is substantially fixed under the metal cover, and the relative position between the two is fixed. Accordingly, when the connector of the electrical connector assembly is to be mated with another electrical connector, the user can use the metal cover as the assembly target. Namely, after the metal cover is assembled to the circuit board, the mating operation of the connectors can be completed at the same time, and mating misalignment can be avoided.

In addition, the metal cover can also provide the signal shielding effect and the grounding effect for the connectors that are mated with each other, and particularly, effectively improve EMI or RFI during high-speed signal transmission.

What is claimed is:

1. An electrical connector assembly comprising:
   an electrical connecting member;
   at least one connector disposed at and electrically connected to the electrical connecting member; and
   at least one metal cover disposed on the electrical connecting member, wherein the electrical connecting member is located between the connector and the metal cover, the connector is covered by the electrical connecting member, and an entirety of the connector falls within a range of the electrical connecting member, wherein the electrical connecting member is a circuit board and comprises at least one grounding part, and the metal cover covers the grounding part and is electrically connected to the grounding part.

2. The electrical connector assembly according to claim 1, wherein the electrical connecting member is a flexible circuit board or a rigid circuit board.

3. The electrical connector assembly according to claim 1, wherein the electrical connector assembly is a board-to-board connector assembly.

4. The electrical connector assembly according to claim 1, wherein the metal cover comprises at least one combining structure.

5. The electrical connector assembly according to claim 4, wherein the metal cover further comprises a body and a plurality of side skirt parts, and the side skirt parts are formed by extending and bending from the body.

6. The electrical connector assembly according to claim 5, wherein the connector is adapted to be mated with another connector on another circuit board and the metal cover is assembled to described another circuit board and covers the connectors that are mated with each other, the combining structure is at least one of the side skirt parts, and described another circuit board further comprises at least one electrical conducting structure and another grounding part for disposing the electrical conducting structure, wherein when the metal cover is assembled to described another circuit board, the combining structure is disposed on the electrical conducting structure, and the metal cover is electrically connected to the another grounding part via the combining structure and the electrical conducting structure.

7. The electrical connector assembly according to claim 5, wherein the connector is adapted to be mated with another connector on another circuit board and the metal cover is assembled to described another circuit board and covers the connectors that are mated with each other, the combining structure is a locking part extending from the side skirt part, described another circuit board further comprises a locking hole and another grounding part, the another grounding part is located in the locking hole, a locking member is adapted to pass through the locking part to combine to the locking hole and connect to the another grounding part, and the metal cover is electrically connected to the another grounding part via the locking part and the locking member.

8. The electrical connector assembly according to claim 6, further comprising at least one guiding member extending from the side skirt part, wherein the guiding member is placed in a guiding hole defined on described another circuit board.

9. The electrical connector assembly according to claim 7, further comprising at least one guiding member extending from the side skirt part, wherein the guiding member is placed in a guiding hole defined on described another circuit board.

10. An electrical connector assembly comprising:
an electrical connecting member;
two connectors respectively disposed on two opposite sides of the electrical connecting member and respectively electrically connected to the electrical connecting member, wherein the electrical connecting member comprises a plurality of circuits which are electrically connected between the two connectors; and
two metal covers respectively disposed on the electrical connecting member, wherein the electrical connecting member is located between the connector and the metal cover, each connector is covered by the electrical connecting member, and an entirety of each connector falls within a range of the electrical connecting member, wherein the electrical connecting member is a circuit board and comprises at least two grounding parts, and the metal cover covers the grounding parts and is electrically connected to the grounding parts.

11. The electrical connector assembly according to claim 10, wherein the electrical connecting member is a flexible circuit board or a rigid circuit board.

12. The electrical connector assembly according to claim 10, wherein the electrical connector assembly is a board-to-board connector assembly.

13. The electrical connector assembly according to claim 10, wherein each metal cover comprises at least one combining structure.

14. The electrical connector assembly according to claim 13 wherein each metal cover further comprises a body and a plurality of side skirt parts, and the side skirt parts are formed by extending and bending from the body.

15. The electrical connector assembly according to claim 14, wherein the connector is adapted to be mated with another connector on another circuit board and each metal cover is assembled to described another circuit board and covers the corresponding connectors that are mated with each other, the combining structure is at least one of the side skirt parts, and described another circuit board further comprises at least one electrical conducting structure and another grounding part for disposing the electrical conducting structure, wherein when each metal cover is assembled to described another circuit board, the combining structure is disposed on the electrical conducting structure, and each metal cover is electrically connected to the another grounding part via the combining structure and the electrical conducting structure.

16. The electrical connector assembly according to claim 14, wherein the connector is adapted to be mated with another connector on another circuit board and each metal cover is assembled to described another circuit board and covers the connectors that are mated with each other, the combining structure is a locking part extending from the side skirt part, described another circuit board further comprises a locking hole and another grounding part, the another grounding part is located in the locking hole, a locking member is adapted to pass through the locking part to combine to the locking hole and connect to the another grounding part, and each metal cover is electrically connected to the another grounding part via the locking part and the locking member.

* * * * *